(12) United States Patent
Lee et al.

(10) Patent No.: US 12,312,185 B2
(45) Date of Patent: May 27, 2025

(54) TOWER LIFT, TOWER LIFT DRIVING METHOD, AND MACHINE READABLE MEDIUM

(71) Applicant: SEMES CO., LTD., Cheonan-si (KR)

(72) Inventors: Na Hyun Lee, Ansan-si (KR); Sang-Oh Kim, Seoul (KR); Myungjin Lee, Hwaseong-si (KR); Heejae Byun, Suwon-si (KR)

(73) Assignee: SEMES CO., LTD., Cheonan-si (KR)

( * ) Notice: Subject to any disclaimer, the term of this patent is extended or adjusted under 35 U.S.C. 154(b) by 1050 days.

(21) Appl. No.: 17/198,200

(22) Filed: Mar. 10, 2021

(65) Prior Publication Data

US 2021/0300693 A1 Sep. 30, 2021

(30) Foreign Application Priority Data

Mar. 30, 2020 (KR) ........................ 10-2020-0038542

(51) Int. Cl.
| | | |
|---|---|---|
| *B65G 54/02* | (2006.01) | |
| *B65G 43/02* | (2006.01) | |
| *B66B 11/04* | (2006.01) | |
| *H01L 21/67* | (2006.01) | |
| *H01L 21/677* | (2006.01) | |
| *B66B 9/00* | (2006.01) | |

(52) U.S. Cl.
CPC ............. *B65G 54/02* (2013.01); *B65G 43/02* (2013.01); *B66B 11/0407* (2013.01); *H01L 21/67178* (2013.01); *H01L 21/67709* (2013.01); *B65G 2203/0275* (2013.01); *B66B 9/003* (2013.01); *B66B 2201/303* (2013.01)

(58) Field of Classification Search
CPC .................. B65G 54/02; B65G 43/02; B65G 2203/0275; B65G 1/04; B65G 2201/0297; B66B 11/0407; B66B 9/003; H01L 21/67709; H01L 21/67178; H01L 21/67742; H01L 21/67727; H01L 21/67712; H02K 41/031; B60L 13/13; B60L 13/035; B60L 13/04; B60L 13/10
USPC .................................................. 104/290, 292
See application file for complete search history.

(56) References Cited

U.S. PATENT DOCUMENTS

2019/0067067 A1   2/2019   Lee et al.
2019/0344978 A1   11/2019   Jun et al.

FOREIGN PATENT DOCUMENTS

| CN | 105247181 | | 1/2016 | |
|---|---|---|---|---|
| CN | 109422167 | | 3/2019 | |
| DE | 2203864 | A1 * | 8/1973 | ............. B66B 9/003 |
| JP | 1996119599 | | 5/1996 | |
| JP | P2016-222449 | | 12/2016 | |
| KR | 10-0726711 | | 6/2007 | |
| KR | 10-0835201 | | 5/2008 | |

(Continued)

OTHER PUBLICATIONS

Office Action from the China National Intellectual Property Administration dated Jan. 31, 2024.

*Primary Examiner* — Zachary L Kuhfuss
*Assistant Examiner* — Heaven R Buffington

(57) ABSTRACT

A tower lift includes a rail module extending in a vertical direction, a plurality of carriage modules that are movable along the rail module, each carriage module having a carriage that carries an object, and an interference avoidance module that avoids travel interference between the carriage modules that move along the rail module.

12 Claims, 12 Drawing Sheets

(56) References Cited

FOREIGN PATENT DOCUMENTS

| | | | |
|---|---|---|---|
| KR | 10-2011-0049936 | 7/2011 | |
| KR | 10-1234704 | 2/2013 | |
| KR | 10-2016-0008462 | 1/2016 | |
| KR | 20180069389 | 6/2018 | |
| KR | 10-1951871 | 2/2019 | |
| KR | 10-2019-0021659 | 3/2019 | |
| WO | WO-02102700 A1 * | 12/2002 | ............... B66B 1/30 |

* cited by examiner

TOWER LIFT, TOWER LIFT DRIVING METHOD, AND MACHINE READABLE MEDIUM

CROSS-REFERENCE TO RELATED APPLICATIONS

A claim for priority under 35 U.S.C. § 119 is made to Korean Patent Application No. 10-2020-0038542 filed on Mar. 30, 2020, in the Korean Intellectual Property Office, the entire contents of which are hereby incorporated by reference.

BACKGROUND

The inventive concept relate to a tower lift, a tower lift driving method, and a machine readable medium, and more particularly, relate to a tower lift for carrying objects in a vertical direction in a multi-story building, a method for driving the tower lift, and a machine readable medium.

In general, a semiconductor or display manufacturing line has multiple stories. Facilities for performing processes, such as deposition, exposure, etching, ion implantation, cleaning, and the like, may be disposed on the stories of the semiconductor manufacturing line. The facilities disposed on the stories of the semiconductor manufacturing line may repeatedly perform a series of unit processes on a semiconductor wafer that is used as a semiconductor substrate or a glass substrate that is used as a display substrate.

Objects, such as semiconductor wafers or glass substrates, may be carried between the stories of the semiconductor manufacturing line by a tower lift vertically installed through the stories of the semiconductor manufacturing line.

The tower lift has a carriage module for carrying objects and a rail module for vertically guiding the carriage module. The rail module is equipped with a driving belt such as a timing belt for raising and lowering the carriage module. The timing belt is coupled with the carriage module and moves the carriage module upward and downward. However, particles may be generated when the timing belt is driven in the tower lift. For example, the timing belt may be driven by friction with pulleys, and particles may be generated by the friction between the timing belt and the pulleys.

In the tower lift, one carriage module is coupled to one timing belt. This is because when a plurality of carriage modules are coupled to a timing belt, the plurality of carriage modules are all raised/lowered in the same direction by the timing belt, and therefore it is difficult to independently control movements of the carriage modules. In the case of the tower lift having the one carriage module, objects are carried by the one carriage module, and therefore efficiency in carrying the objects between the stories of the semiconductor manufacturing line may be deteriorated.

SUMMARY

Embodiments of the inventive concept provide a tower lift for minimizing particles generated when objects are carried, a method for driving the tower lift, and a machine readable medium.

Furthermore, embodiments of the inventive concept provide a tower lift for operating a plurality of carriage modules movable independently of one another, a method for driving the tower lift, and a machine readable medium.

In addition, embodiments of the inventive concept provide a tower lift for avoiding travel interference among a plurality of carriage modules when the plurality of carriage modules are operated, a method for driving the tower lift, and a machine readable medium.

The technical problems to be solved by the inventive concept are not limited to the aforementioned problems, and any other technical problems not mentioned herein will be clearly understood from the following description by those skilled in the art to which the inventive concept pertains.

According to an embodiment, a tower lift includes a rail module extending in a vertical direction, a plurality of carriage modules that are movable along the rail module, each carriage module having a carriage that carries an object, and an interference avoidance module that avoids travel interference between the carriage modules that move along the rail module.

According to an embodiment, each of the carriage modules may be movable along the rail module in a magnetic levitation manner.

According to an embodiment, the interference avoidance module may include a plurality of rails which are spaced apart from each other in a horizontal direction different from the vertical direction, one of the plurality of rails being aligned with the rail module, a body on which the rails installed, and a driving part connected to the body and moving the body in a horizontal direction.

According to an embodiment, each of the rails may extend lengthwise in the vertical direction.

According to an embodiment, the rail module may be divided into a plurality of segmented rail modules which are spaced apart from each other in the vertical direction, and the interference avoidance module is disposed between two adjacent segmented rail modules among the plurality of segmented rail modules.

According to an embodiment, the tower lift further comprises a controller, the plurality of carriage modules includes a first carriage module and a second carriage module moving in a first direction, the first carriage module being ahead of the second carriage module in the first direction, and when the controller sets such that the second carriage module moves ahead of the first carriage module in the first direction, and travel interference is predicted to occur between the first carriage module and the second carriage module, the controller is configured to control the driving part, and the first and second carriage modules such that the first carriage module is moved on a first rail of the plurality of rails that is combined with the rail module, the body is moved in the horizontal direction, and the rail module is combined with a second rail of the plurality of rails instead of the first rail.

According to an embodiment, the controller is configured to, after the second rail is combined with the rail module, control the second carriage module such that the second carriage module is moved along the second rail combined with the rail module.

According to an embodiment, the rail module may include a frame extending in the vertical direction and a linear motor coil installed on the frame. Each of the carriage modules may include a linear motor magnet that is coupled with the carriage and that interacts with the linear motor coil to move the carriage in the vertical direction.

According to an embodiment, the linear motor coil may include a plurality of linear motor coils installed on the frame so as to be spaced apart from each other along the vertical direction.

According to an embodiment, the rail module may further include at least one guide rail installed on the frame, the carriage module may further include a guide part that moves along the guide rail, and the guide rail and the guide part may be spaced apart from each other by a magnetic repulsive force.

According to an embodiment, the rail module may further include a power transmitter, the carriage module may further include a power receiver that receives power transmitted by the power transmitter, and the power transmitter may transmit the power to the power receiver in a non-contact manner.

According to an embodiment, provided is a method for driving a tower lift, in which a plurality of carriage modules that carry containers having objects received therein are moved along a rail module extending in a vertical direction, and when travel interference is predicted to occur between a first carriage module that is one of the carriage modules and a second carriage module that is another one of the carriage modules, one of the first carriage module and the second carriage module is moved to an interference avoidance module having a plurality of rails capable of being combined with the rail module, and a position of one of the rails that is combined with the rail module is changed such that the one carriage module moved to the interference avoidance module is laterally moved.

According to an embodiment, another one of the rails may be combined with the rail module when the position of the one rail is completely changed.

According to an embodiment, the other one of the first carriage module and the second carriage module may move along the other rail and the rail module when the other rail is combined with the rail module.

According to an embodiment, the carriage modules may move along the rail module in a magnetic levitation manner.

According to an embodiment, a machine readable medium for storing a program executed by at least one controller, wherein the program includes sets of instructions to determine whether travel interference is predicted to occur between a first carriage module and a second carriage module moving in a first direction along a rail module, wherein the first carriage module is ahead of the second carriage module in the first direction, and the first direction is parallel to a vertical direction in which the rail module extends, move, in response to the determining of the prediction of the travel interference, the first carriage module from a portion of the rail module to a first rail of the plurality of rails of an interference avoidance module, the first rail being combined with the portion of the rail module, move a body of the interference avoidance module in a horizontal direction so that the portion of the rail module is combined with a second rail of the plurality of rails instead of the first rail thereof, and move, after the second rail being combined with the portion of the rail module, the second carriage module in the first direction along the second rail combined with the portion of the rail module.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
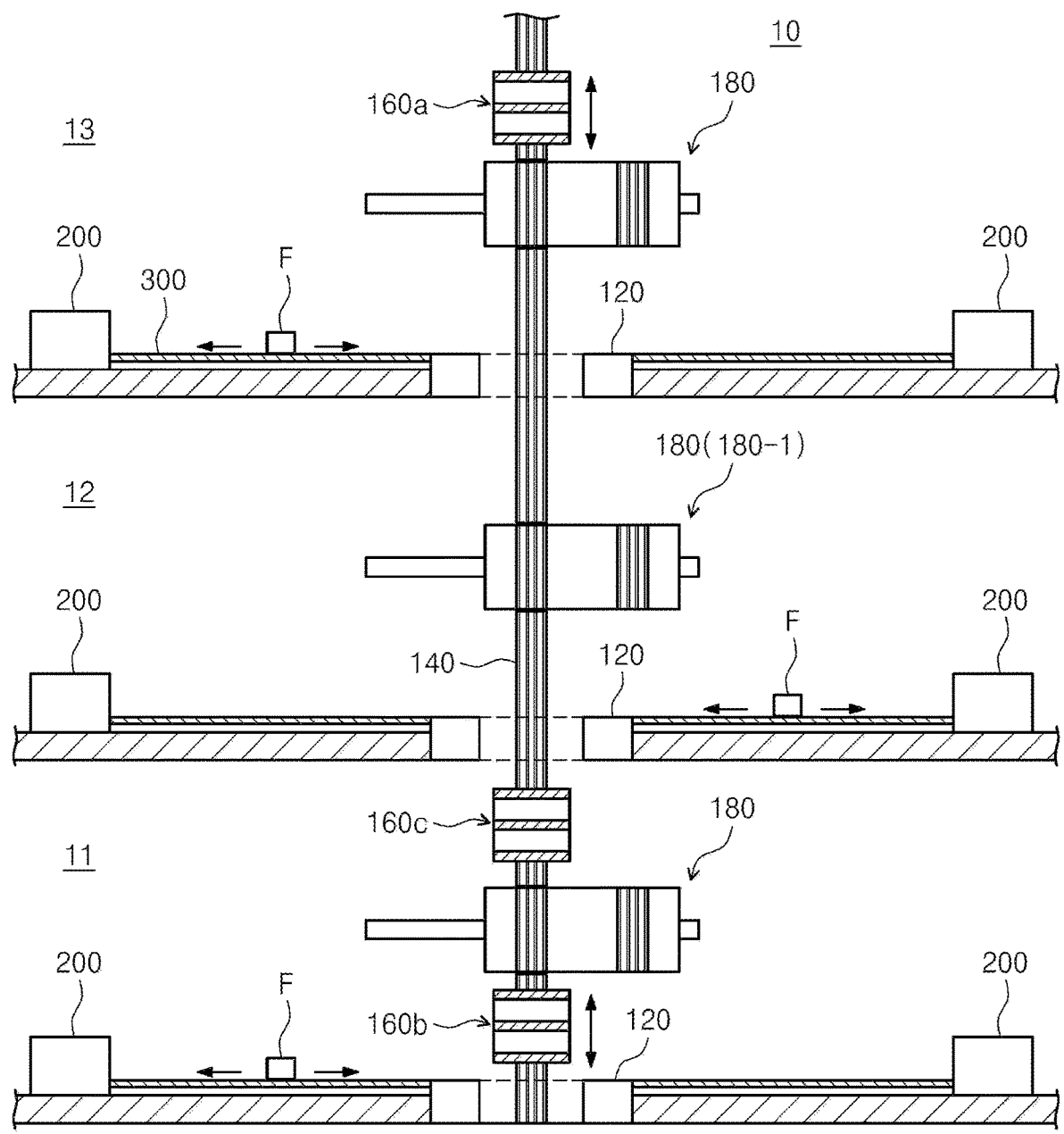
FIG. 1 is a schematic view illustrating a semiconductor manufacturing line in which a tower lift according to an embodiment of the inventive concept is installed.

Hereinafter, embodiments of the inventive concept will be described in detail with reference to the accompanying drawings such that those skilled in the art to which the inventive concept pertains can readily carry out the inventive concept. However, the inventive concept may be implemented in various different forms and is not limited to the embodiments described herein. Furthermore, in describing the embodiments of the inventive concept, detailed descriptions related to well-known functions or configurations will be omitted when they may make subject matters of the inventive concept unnecessarily obscure. In addition, components performing similar functions and operations are provided with identical reference numerals throughout the accompanying drawings.

The terms "include" and "comprise" in the specification are "open type" expressions just to say that the corresponding components exist and, unless specifically described to the contrary, do not exclude but may include additional components. Specifically, it should be understood that the terms "include", "comprise", and "have", when used herein, specify the presence of stated features, integers, steps, operations, components, and/or parts, but do not preclude the presence or addition of one or more other features, integers, steps, operations, components, parts, and/or groups thereof.

The terms of a singular form may include plural forms unless otherwise specified. Furthermore, in the drawings, the shapes and dimensions of components may be exaggerated for clarity of illustration.

A tower lift according to this embodiment may be used to carry objects. In particular, the tower lift according to this embodiment may carry a container having the objects received therein. The objects may be wafers, glass substrates, or reticles. The container having the objects received therein may be a front opening unified pod (FOUP). Alternatively, the container having the objects received therein may be a POD. In another case, the container having the objects received therein may be a magazine having a plurality of printed circuit boards received therein, a tray having a plurality of semiconductor packages received therein, or the like.

FIG. 1 is a schematic view illustrating a semiconductor manufacturing line in which a tower lift according to an embodiment of the inventive concept is installed. Referring to FIG. 1, the semiconductor manufacturing line 10 may have a multi-story structure. For example, the semiconductor manufacturing line 10 may have a first story 11, a second story 12, and a third story 13. However, without being limited thereto, the multi-story structure of the semiconductor manufacturing line 10 may be two-story structure or three or more story structure.

A tower lift 100, container storages 200, transport rails 300, and semiconductor manufacturing apparatuses (not illustrated) that perform semiconductor manufacturing processes may be provided in the semiconductor manufacturing line 10.

The tower lift 100 may carry containers F, each having objects received therein, between the stories 11, 12, and 13 of the semiconductor manufacturing line 10. The tower lift 100 may include stage modules 120, a rail module 140, a carriage module 160, and an interference avoidance module 180.

The stage modules 120 may be installed on the floors of the stories 11, 12, and 13 of the semiconductor manufacturing line 10, respectively. The stage modules 120 may be coupled with the transport rails 300 that transport the containers F to the container storages 200. When the tower lift 100 carries the containers F to the stories 11, 12, and 13, the containers F carried to the stories 11, 12, and 13 may be transported to the container storages 200 by the transport rails 300.

The rail module 140 may extend in a vertical direction. The rail module 140 may vertically extend between at least two stories of the semiconductor manufacturing line 10. The rail module 140 may guide a movement of the carriage module 160 that will be described below. Furthermore, the rail module 140 may vertically move the carriage module 160 that will be described below.

The carriage module 160 may be configured to be movable along the rail module 140. For example, the carriage module 160 may be configured to be movable in the vertical direction along the rail module 140. The carriage module 160 may have a carriage 162 (see, FIG. 2) that carries an object. The carriage module 160 may include a plurality of carriage modules. For example, the carriage module 160 may include a first carriage module 160a and a second carriage module 160b. Although FIG. 1 illustrates an example that the carriage module 160 includes the two carriage modules 160a and 160b, the number of carriage modules may be modified in various ways.

The carriage modules 160a and 160b may have a mounting shelf on which the container F having the objects received therein is mounted. Alternatively, the carriage modules 160a and 160b may have a robot that grasps the container F. The carriage modules 160a and 160b may be modified in various structures capable of moving the container F.

The interference avoidance module 180 may be configured to avoid travel interference between the carriage modules 160a and 160b that move along the rail module 140. At least one interference avoidance module 180 may be provided. For example, the interference avoidance module 180 may be provided for each of the stories 11, 12, and 13 of the semiconductor manufacturing line 10. However, without being limited thereto, the interference avoidance module 180 may be provided for some of the stories 11, 12, and 13. Alternatively, the rail module 140 may be divided into at least two segments, and the interference avoidance module 180 may be disposed between the segments of the rail module 140.

For the sake of description, it is assumed that two carriage modules 160b and 160 are moved upwardly along the rail module 140. The carriage module 160c and the carriage module 160b are called a first carriage module and a second carriage module moving in a first direction (e.g., upwardly) along the rail module 140. The first carriage module 160c is ahead of the second carriage module 160b. For a process sequence operated in the semiconductor manufacturing line 10, the second carriage module 160b may move ahead of the first carriage module 160c. In this case, a controller may detect travel interference between the first and second carriage modules 160c and 160b, and may control the rail module, and the first and second carriage modules 160c and 160 such that the first carriage module 160c is moved, in response to the determining of the prediction of the travel interference, from a portion of the rail module 140 to a first rail of an interference avoidance module 180-1, the first rail being combined with the portion of the rail module 140, a body of the interference avoidance module is moved in a horizontal direction so that the portion of the rail module 140 is combined with a second rail instead of the first rail thereof, after the second rail being combined with the portion of the rail module 140, the second carriage module is moved in the first direction along the second rail combined with the portion of the rail module 140.

Hereinafter, the rail module 140, the carriage module 160, and the interference avoidance module 180 according to an embodiment of the inventive concept will be described in detail. The structures and functions of the first carriage module 160a and the second carriage module 160b described above may be the same as, or similar to, each other. The structure and function of the carriage module 160, which will be described below, may be identically or similarly applied to the first carriage module 160a and the second carriage module 160b.

Figure 2:
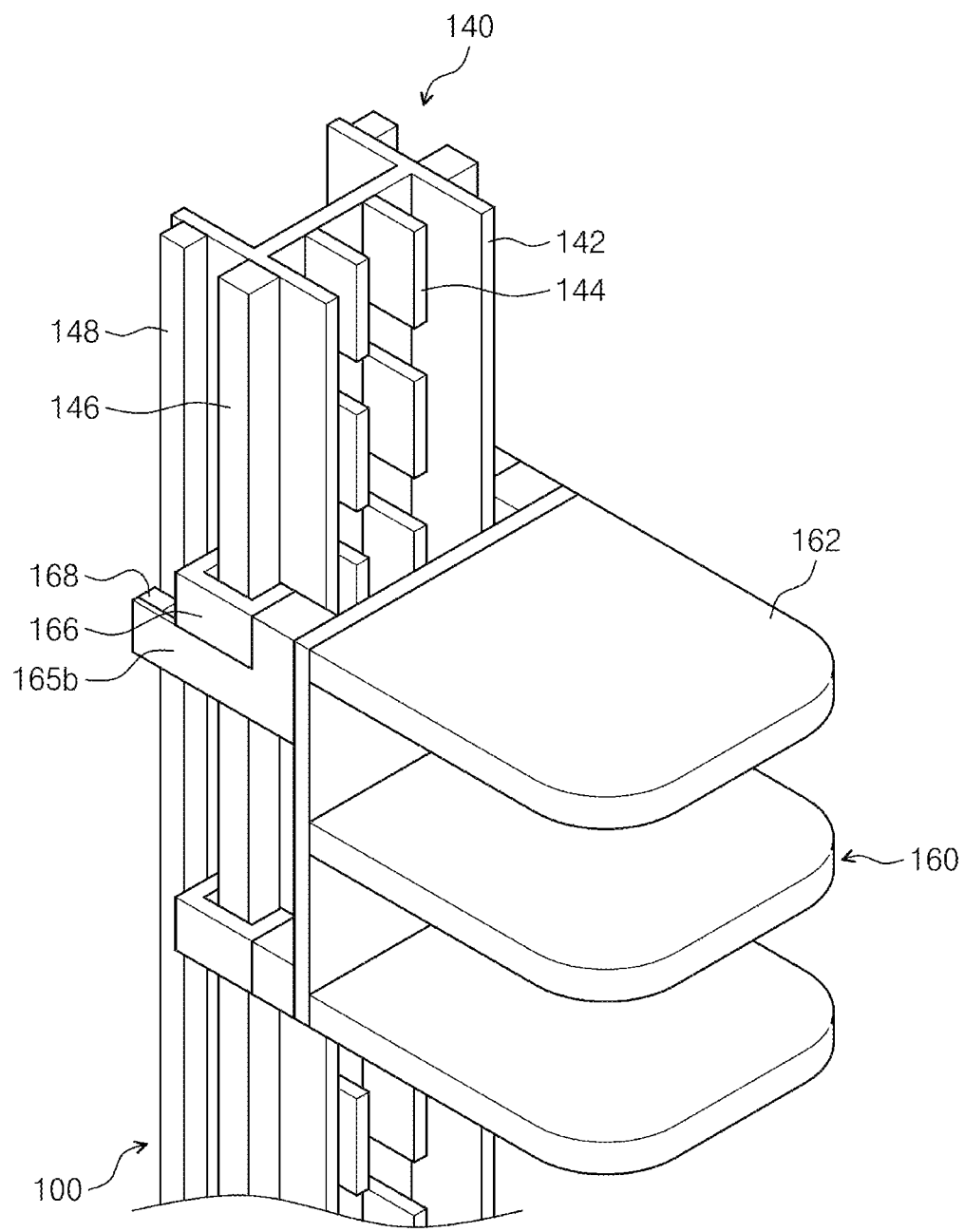
FIG. 2 is a perspective view illustrating a rail module and a carriage module of the tower lift according to an embodiment of the inventive concept.
Figure 3:
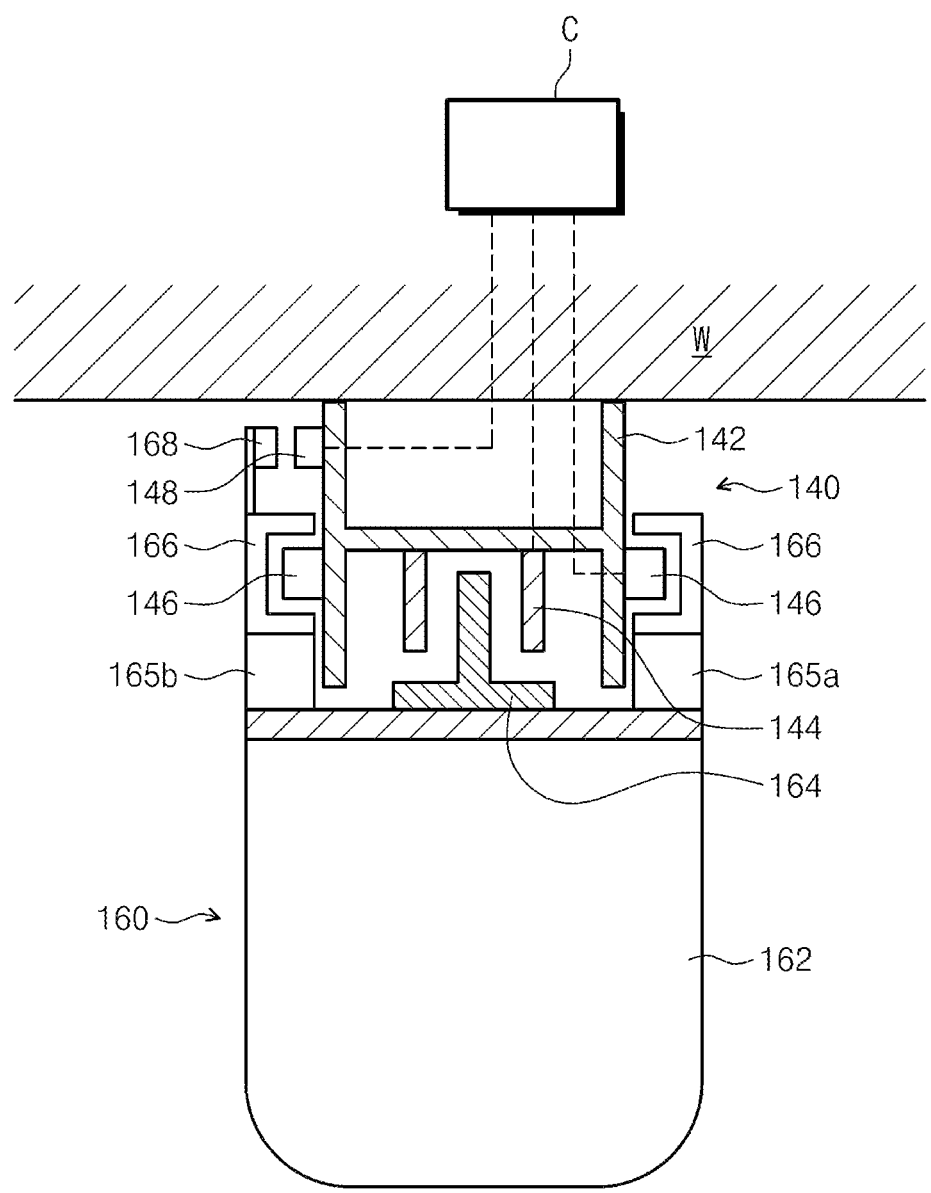
FIG. 3 is a horizontal sectional view illustrating the rail module and the carriage module of the tower lift according to the embodiment of the inventive concept.

FIG. 2 is a perspective view illustrating the rail module and the carriage module of the tower lift according to an embodiment of the inventive concept. FIG. 3 is a horizontal sectional view illustrating the rail module and the carriage module of the tower lift according to the embodiment of the inventive concept.

Referring to FIGS. 2 and 3, the rail module 140 may include a frame 142, a linear motor coil 144, guide rails 146, and a power transmitter 148.

The frame 142 may extend along the vertical direction. The frame 142 may have a lengthwise direction parallel to the vertical direction. The frame 142 may be fixed to a wall W of the semiconductor manufacturing line 10. The linear motor coil 144, the guide rails 146, and the power transmitter 148, which will be described below, may be coupled to the frame 142. The frame 142 may have the shape of "H" as a whole when viewed from above. However, without being limited thereto, the shape of the frame 142 may be modified in various ways.

The linear motor coil 144 may interact with a linear motor magnet 164, which will be described below, to move the carriage 162 in the vertical direction. The interaction may be caused by a magnetic force generated by the linear motor coil 144 and/or the linear motor magnet 164. The linear motor coil 144 may be installed on the frame 142. The linear motor coil 144 may be installed on a surface of the frame 142 that faces the carriage module 160 when viewed from above. A pair of linear motor coils 144 may be provided. The pair of linear motor coils 144 may be spaced apart from each other. The linear motor magnet 164, which will be described below, may be inserted between the pair of linear motor coils 144 spaced apart from each other.

An interface line (not illustrated), such as a power line, may be connected to the linear motor coils 144. Furthermore, a plurality of pairs of linear motor coils 144 may be provided. The plurality of pairs of linear motor coils 144 may be installed on the frame 142 so as to be spaced apart from each other along the vertical direction in which the frame 142 extends.

The guide rails 146 may restrict some of the degrees of freedom of the carriage module 160. The guide rails 146 may restrict the remaining degrees of freedom other than a translational degree of freedom of the carriage module 160 along the vertical direction. The guide rails 146 may be spaced apart from guide parts 166 of the carriage module 160, which will be described below, by magnetic repulsive forces. An interface line (not illustrated), such as a power line, may be connected to the guide rails 146. Furthermore, the guide rails 146 or the guide parts 166 may be equipped with gap sensors (not illustrated), and the magnetic forces may be controlled based on measurement values measured by the gap sensors. Accordingly, the gaps between the guide rails 146 and the guide parts 166 may be controlled to be substantially constant.

One or more guide rails 146 may be provided. For example, a plurality of guide rails 146 may be provided. One of the guide rails 146 may be installed on one surface of the frame 142, and another one of the guide rails 146 may be installed on an opposite surface of the frame 142. For example, the one guide rail 146 may be installed on one sidewall of the frame 142, and the other guide rail 146 may be installed on an opposite sidewall of the frame 142. Furthermore, the lengthwise direction of the guide rails 146 may be parallel to the lengthwise direction of the frame 142.

The power transmitter 148 may transmit power to a power receiver 168 of the carriage module 160 that will be described below. For example, the power transmitter 148 may be one of components of a contactless power supply device (HID) that supplies power in a non-contact manner. The power transmitter 148 may be installed on the frame 142. The power transmitter 148 may be installed on one of the surfaces of the frame 142 on which the guide rails 146 are installed. For example, the power transmitter 148 may be installed on one of the sidewalls of the frame 142 on which the guide rails 146 are installed. An interface line (not illustrated), such as a power line, may be connected to the power transmitter 148.

The carriage module 160 may carry the container F having the objects received therein. The carriage module 160 may be configured to be movable in the vertical direction along the rail module 140. The carriage module 160 may be moved in the vertical direction along the rail module 140 and may carry the container F having the objects received therein to the stories 11, 12, and 13 of the semiconductor manufacturing line 10. The carriage module 160 may include the carriage 162, the linear motor magnet 164, connecting bodies 165a and 165b, the guide parts 166, and the power receiver 168.

The carriage 162 may have the shape of a mounting shelf on which the container F having the objects received therein is mounted. The carriage 162 may be equipped with a robot (not illustrated) that grasps the container F having the objects received therein. In FIG. 2, the carriage 162 is illustrated as having the shape of a rack with three shelves. However, without being limited thereto, the shape of the carriage 162 may be modified in various ways.

The linear motor magnet 164 may be coupled to the carriage 162. The linear motor magnet 164 may interact with the above-described linear motor coils 144 to move the carriage 162 in the vertical direction. The interaction may be caused by a magnetic force generated by the linear motor coils 144 and/or the linear motor magnet 164.

The linear motor magnet 164 may be inserted between the pair of linear motor coils 144. Part of the linear motor magnet 164 may be inserted between the pair of linear motor coils 144. For example, the linear motor magnet 164 may have the shape of "T" as a whole when viewed from above, and one of three shelves may be inserted between the linear motor coils 144.

The connecting bodies 165a and 165b may couple the guide parts 166, which will be described below, and the power receiver 168 to the carriage 162. The connecting bodies 165a and 165b may include the first connecting body 165a and the second connecting body 165b. The first connecting body 165a and the second connecting body 165b may have different shapes. The second connecting body 165b may couple the guide part 166 and the power receiver 168 to the carriage 162. The first connecting body 165a may couple the guide part 166 to the carriage 162.

The guide parts 166 may be coupled to the carriage 162 by the connecting bodies 165a and 165b. Accordingly, when the carriage 162 is moved, the guide parts 166 may be moved along the vertical direction together with the carriage 162. Each of the guide parts 166 may have a shape surrounding at least part of a corresponding one of the guide rails 146 installed on the frame 142. The guide part 166 may have the shape of "⊂" when viewed from above. The guide rails 146 may be inserted into the guide parts 166. Accordingly, the guide parts 166, together with the guide rails 146, may restrict the remaining degrees of freedom other than a translational degree of freedom of the carriage module 160 along the vertical direction. Furthermore, the guide rails 146 or the guide parts 166 may be equipped with the gap sensors (not illustrated), and the magnetic forces may be controlled based on measurement values measured by the gap sensors. Accordingly, the gaps between the guide rails 146 and the guide parts 166 may be controlled to be substantially constant.

The power receiver 168 may receive power transmitted from the power transmitter 148. The power receiver 168 may be installed to face the power transmitter 148. The power receiver 168 may be one of the components of the contactless power supply device (HID) that supplies power in a non-contact manner. The power receiver 168 may be coupled with the carriage 162 through the second connecting body 165b. Accordingly, when the carriage 162 is moved, the power receiver 168 may be moved along the vertical direction together with the carriage 162.

The carriage module 160 according to the embodiment of the inventive concept may include the linear motor magnet 164, and the linear motor magnet 164 may interact with the linear motor coils 144 to move the carriage 162 along the rail module 140. That is, the carriage module 160 according to the embodiment of the inventive concept may move along the rail module 140 in a magnetic levitation manner. A general tower lift moves a carriage module using friction between a timing belt and pulleys. In this case, particles may be generated. However, the carriage module 160 according to the embodiment of the inventive concept may move along the rail module 140 in a magnetic levitation manner. Accordingly, particles may be minimized.

Furthermore, the carriage module 160 may include the power receiver 168, and the power receiver 168 may receive power from the power transmitter 148 in a non-contact manner. That is, the power receiver 168 may receive, in a non-contact manner, power required to drive the carriage module 160. Moreover, in the inventive concept, the linear motor coils 144 requiring connection of a power line may be installed on the frame 142, and the carriage module 160 may include the linear motor magnet 164 not requiring connection of a power line. That is, interface lines such as power lines may all be connected to the components of the rail module 140, and no interfaces lines may be connected to the carriage module 160. In a case where interface lines are connected to the carriage module 160, the connected interface lines may act as components that hamper operation of the carriage module 160. However, in the inventive concept, no interface lines are connected to the carriage module 160, and thus the carriage module 160 may be more easily operated.

In addition, the rail module 140 may include the plurality of pairs of linear motor coils 144 that are installed on the frame 142 so as to be spaced apart from each other along the lengthwise direction of the frame 142. Accordingly, a controller C may control the carriage modules 160 to be movable independently of each other, by varying electric current delivered to a selected one of the plurality of pairs of linear motor coils 144.

Figure 4:
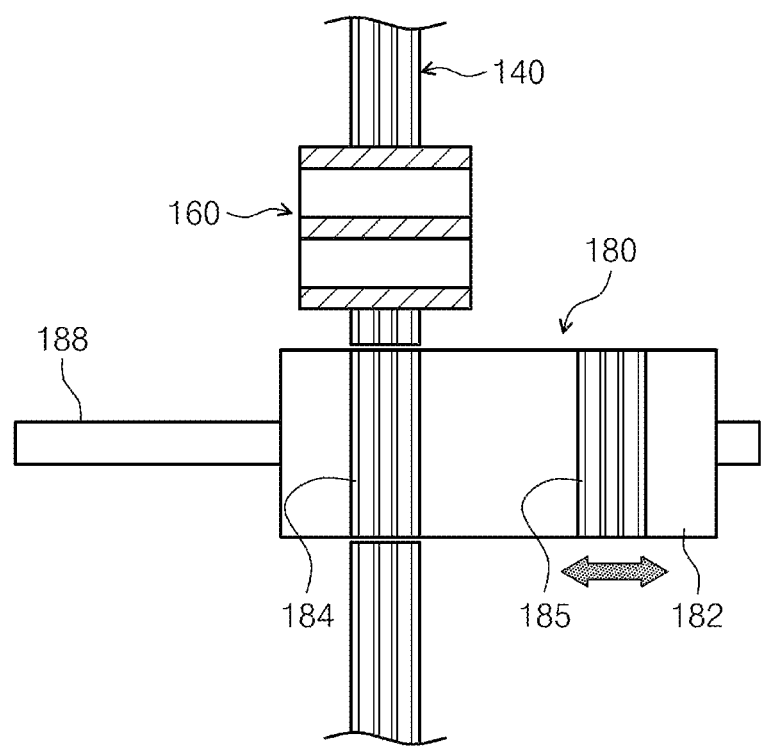
FIG. 4 is a view illustrating an interference avoidance module of the tower lift according to an embodiment of the inventive concept.

FIG. 4 is a view illustrating the interference avoidance module of the tower lift according to an embodiment of the inventive concept. Referring to FIG. 4, the interference avoidance module 180 may be installed between the segments into which the rail module 140 is divided. The interference avoidance module 180 may be installed on the wall W of the semiconductor manufacturing line 10. The interference avoidance module 180 may be configured to avoid travel interference between the plurality of carriage modules 160 that move along the rail module 140. In an embodiment, the carriage module 160 may be moved along the rail module 140 (e.g., the frame 142 and guide rails 146), and the interference avoidance modules 180 connecting the segmented rail modules 140 adjacent to each other in the vertical direction. For example, the frame 142 may be segmented into a plurality of segmented frames. The carriage module 160 may be moved upwardly or downwardly between the two segmented frames (i.e., two segmented rail modules) via one of the two rails 184 and 185 of the interference avoidance module 180.

The interference avoidance module 180 may include a body 182, rails 184 and 185, and a driving part 188.

The body 182 may be moved by receiving power from the driving part 188. For example, the driving part 188 may transmit power to the body 182 and may move the body 182 in a horizontal direction. The driving part 188 may include an actuator (not illustrated) and a linear rail. Furthermore, the rails 184 and 185 may be installed on the body 182.

The plurality of rails 184 and 185 may be provided. The plurality of rails 184 and 185 may be installed on the body 182 so as to be spaced apart from each other along the horizontal direction. For example, the rails 184 and 185 may include the first rail 184 and the second rail 185. The lengthwise direction of the rails 184 and 185 may be in agreement with the lengthwise direction of the rail module 140. For example, the lengthwise direction of the rails 184 and 185 may be in agreement with the vertical direction. The rails 184 and 185 may have a shape capable of being combined with the rail module 140. For example, in a case where the first rail 184 is located between the at least two segments into which the rail module 140 is divided, the first rail 184 may form part of a travel path along which the carriage module 160 moves. Similarly, in a case where the second rail 185 is located between the at least two segments into which the rail module 140 is divided, the second rail 185 may form part of a travel path along which the carriage module 160 moves. Furthermore, the rails 184 and 185 may include the same components as, or components similar to, those of the rail module 140 to perform the same function as, a function similar to, that of the above-described rail module 140.

Hereinafter, a method for driving the tower lift 100 according to an embodiment of the inventive concept will be described in detail. The tower lift 100 according to the embodiment of the inventive concept may include the controller C, and the controller C may control operations of the components of the tower lift 100. For example, the controller C may control operations of the components of the tower lift 100 to perform the tower lift driving method that will be described below. The tower lift driving method, which will be described below, may be stored in a program that is executed by at least one controller C. That is, the program may include sets of instructions that implement the tower lift driving method to be described below. The program may be stored in a machine readable medium.

Figure 5:
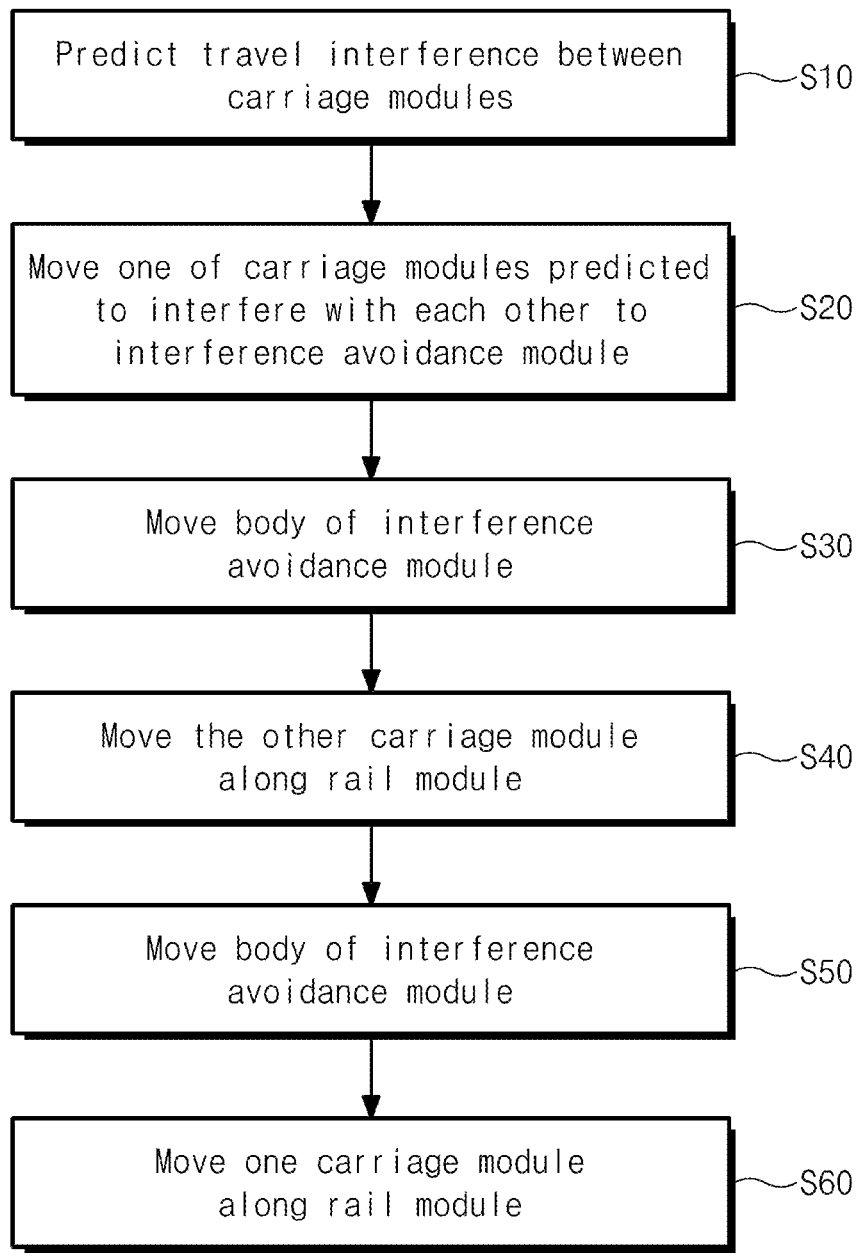
FIG. 5 is a flowchart illustrating a method for driving the tower lift according to an embodiment of the inventive concept.

FIG. 5 is a flowchart illustrating the tower lift driving method according to the embodiment of the inventive concept. FIGS. 6 to 11 are views illustrating the tower lift driving method of FIG. 5.

The tower lift driving method according to the embodiment of the inventive concept enables avoidance of travel path interference between the plurality of carriage modules 160 in a case where the tower lift 100 operates the plurality of carriage modules 160.

Figure 6:
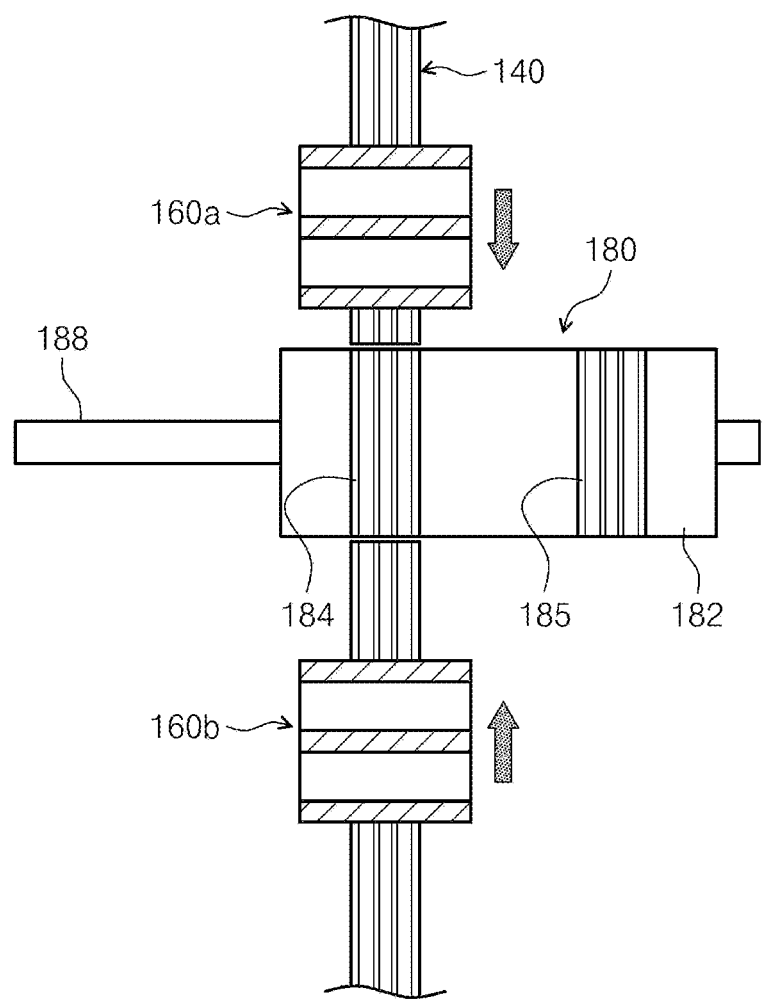
FIGS. 6 to 11 are views illustrating the tower lift driving method of FIG. 5.

For example, in a case where the plurality of carriage modules 160 that carry the containers F are moved along the rail module 140, the tower lift driving method according to the embodiment of the inventive concept may predict whether travel interference occurs between the first carriage module 160a, which is one of the carriage modules 160, and the second carriage module 160b, which is another one of the carriage modules 160 (S10). For example, in a case where the first carriage module 160a and the second carriage module 160b move in opposite directions as illustrated in FIG. 6, the controller C may determine and predict that travel interference will occur between the first carriage module 160a and the second carriage module 160b.

Figure 7:
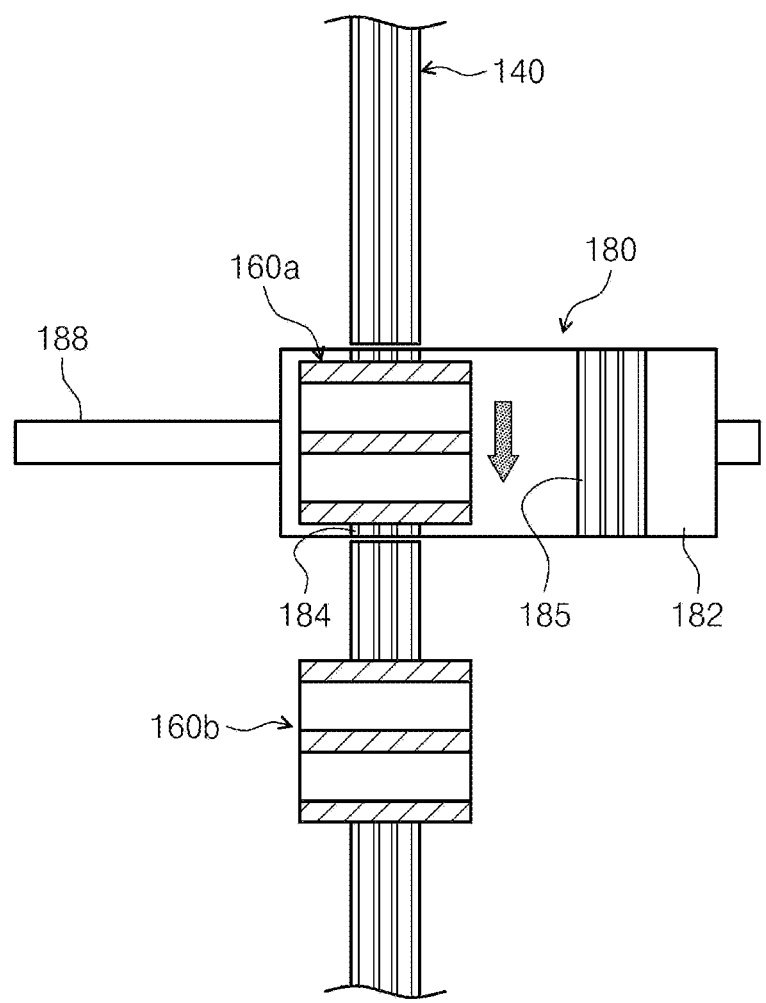

When the controller C predicts that travel interference will occur between the first carriage module 160a and the second carriage module 160b, the controller C may move one of the first carriage module 160a and the second carriage module 160b to the interference avoidance module 180 (S20). For example, as illustrated in FIG. 7, the controller C may move the first carriage module 160a to the first rail 184 of the interference avoidance module 180.

Figure 8:
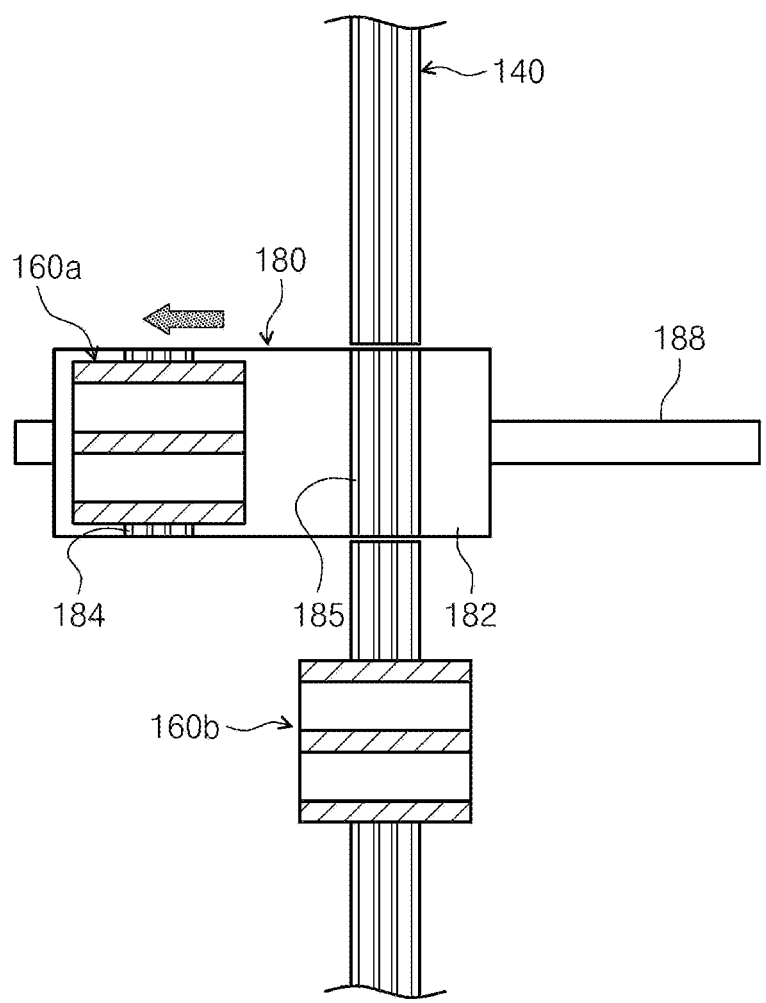

Thereafter, the controller C may control the driving part 188 to move the body 182 (S30). That is, the controller C may laterally move one of the rails 184 and 185 that is combined with the rail module 140. Accordingly, the one carriage module moved to the interference avoidance module 180 may be laterally moved. When the position of the one rail is completely changed, the other one of the rails 184 and 185 may be combined with the rail module 140. For example, as illustrated in FIG. 8, the controller C may control the driving part 188 to move the body 182 in the horizontal direction such that the first rail 184 deviates from the rail module 140 and the second rail 185 is combined with the rail module 140 to form a new travel path. Furthermore, the first carriage module 160a located on the first rail 184 may be laterally moved. At this time, the controller C may apply power to the linear motor coils 144 over the first rail 184 to prevent the first carriage module 160a from deviating from the first rail 184.

Figure 9:
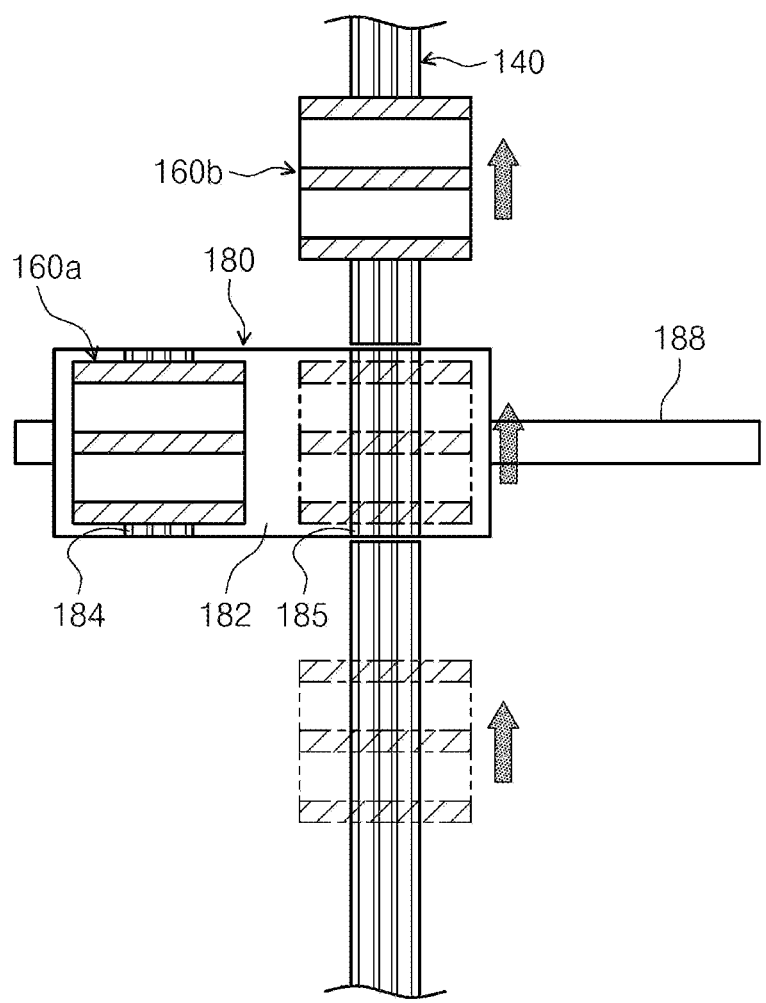

When the other rail is combined with the rail module 140 to form the new travel path, the controller C may control the carriage modules 160 such that the other one of the first carriage module 160a and the second carriage module 160b moves along the rail module 140 and the other rail (S40). For example, as illustrated in FIG. 9, when the second rail 185 is combined with the rail module 140 to form a new travel path, the controller C may control the second carriage module 160b such that the second carriage module 160b moves along the rail module 140 and the second rail 185.

Figure 10:
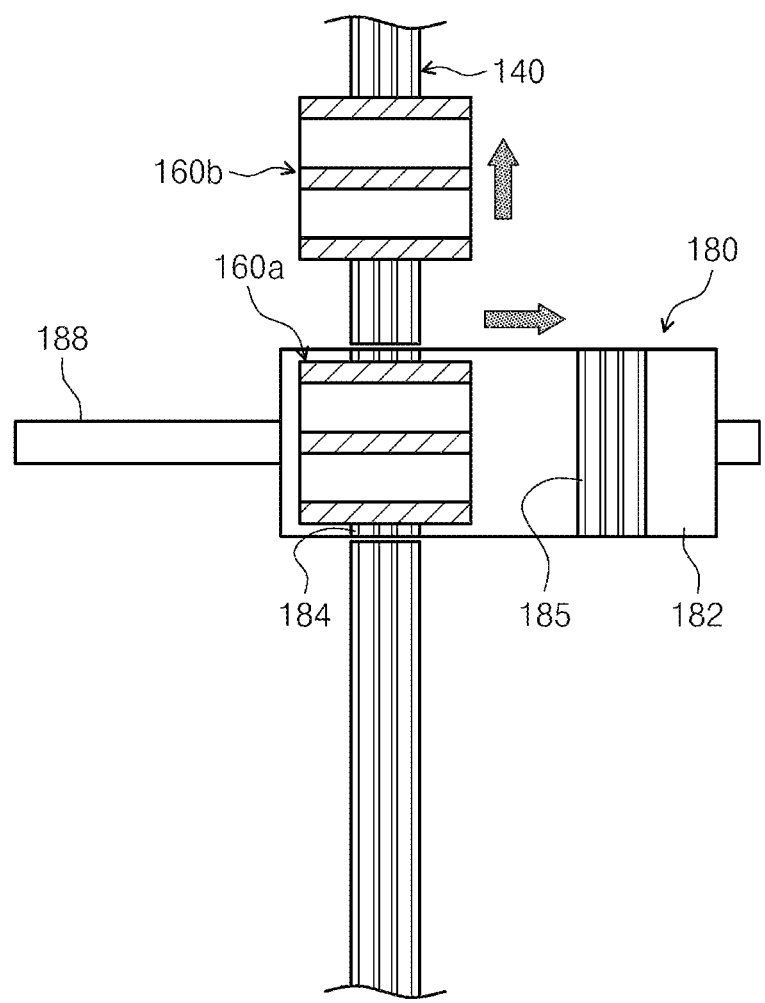

Thereafter, the controller C may control the driving part 188 to move the body 182 again (S50). Accordingly, the one carriage module may be laterally moved. For example, as illustrated in FIG. 10, the first rail 184 on which the first carriage module 160a is located may be laterally moved and may be combined with the rail module 140 to form a travel path again.

Figure 11:
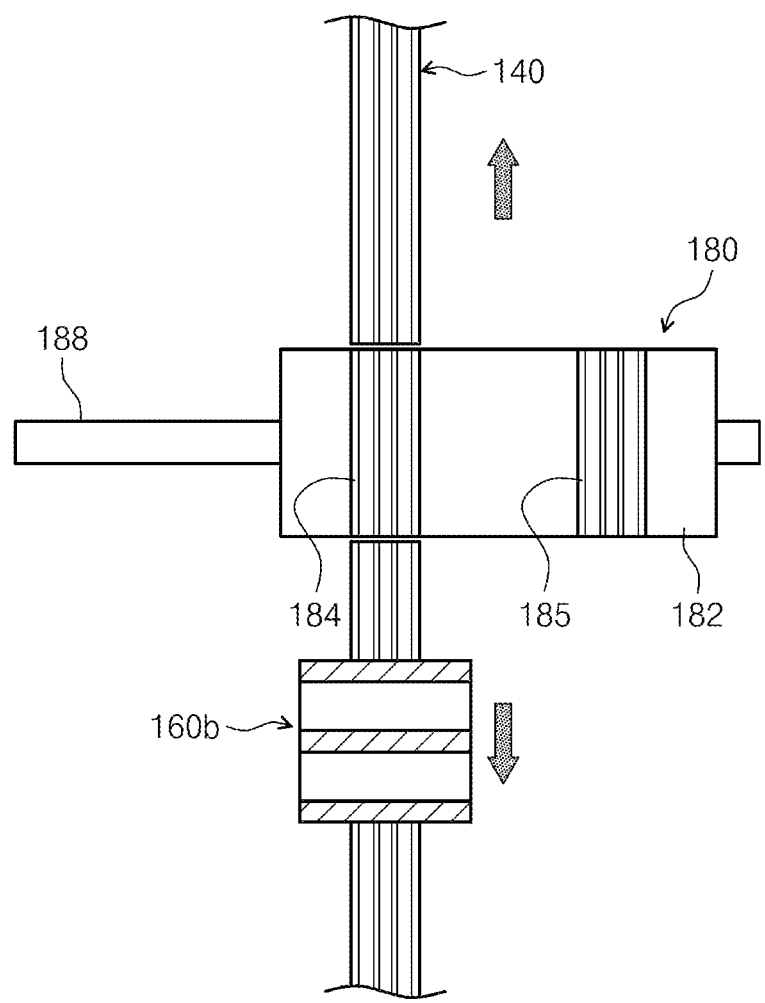

When the one rail is combined with the rail module 140 to form the travel path again, the controller C may control the carriage modules 160 such that the one carriage module moves along the rail module 140 and the one rail (S60). For example, as illustrated in FIG. 11, when the first rail 184 is combined with the rail module 140 to form a new travel path, the controller C may control the first carriage module 160a such that the first carriage module 160a moves along the rail module 140 and the first rail 184.

The above-described tower lift driving method according to the embodiment of the inventive concept enables avoidance of travel interference between the carriage modules 160 that is likely to occur when the tower lift 100 operates the plurality of carriage modules 160.

Figure 12:
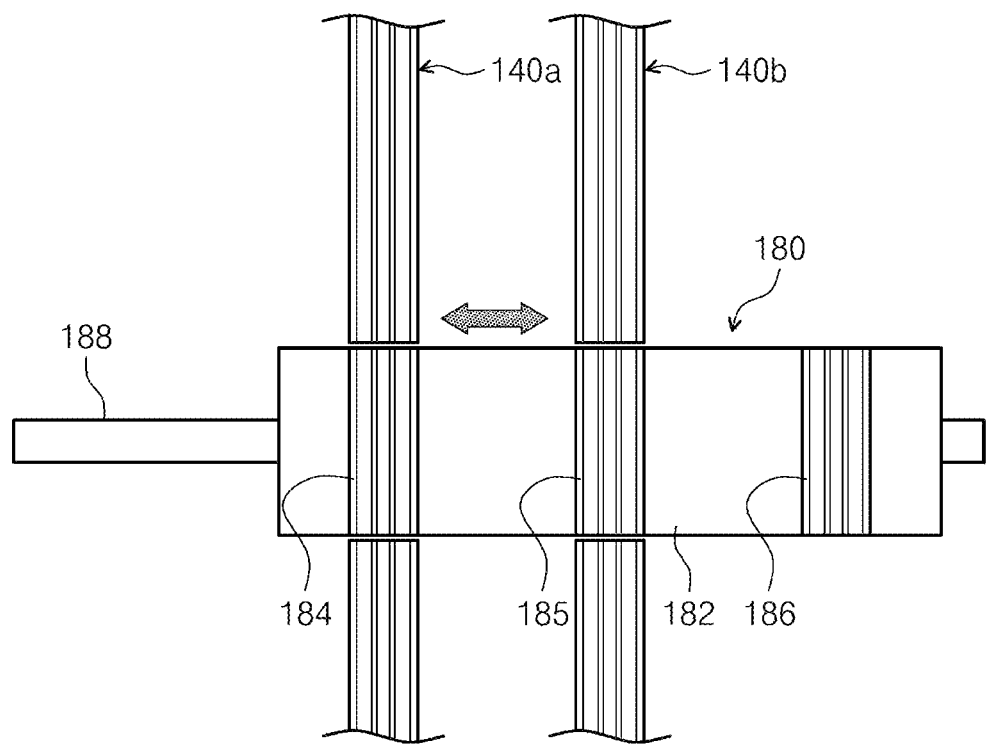
FIG. 12 is a view illustrating a rail module and an interference avoidance module of a tower lift according to another embodiment of the inventive concept.

Although it has been exemplified that the rail module 140 provides only one travel path, the inventive concept is not limited thereto. For example, as illustrated in FIG. 12, a plurality of rail modules may be provided. For example, the rail modules may include a first rail module 140a and a second rail module 140b. The first rail module 140a and the second rail module 140b may provide travel paths along which carriage modules 160 move. An interference avoidance module 180 may be installed between segments into which the first rail module 140a is divided and between segments into which the second rail module 140b is divided. The interference avoidance module 180 may include a body 182, a first rail 184, a second rail 185, and a third rail 186. The first rail 184, the second rail 185, and the third rail 186 may be combined with the first rail module 140a or the second rail module 140b to form a travel path. The interference avoidance module 180 according to the other embodiment of the inventive concept enables not only avoidance of travel interference between the carriage modules 160 but also movements of the carriage modules 160 between the first rail module 140a and the second rail module 140b.

Although it has been exemplified that the tower lift 100 is provided in the semiconductor manufacturing line 10, the tower lift 100 is not limited thereto. For example, the tower lift 100 may be identically or similarly applied to various manufacturing lines requiring conveyance of objects.

According to the embodiments of the inventive concept, particles generated when objects are carried may be minimized.

Furthermore, according to the embodiments of the inventive concept, a plurality of carriage modules movable independently of one another may be operated.

In addition, according to the embodiments of the inventive concept, travel interference among a plurality of carriage modules may be avoided when the plurality of carriage modules are operated.

Effects of the inventive concept are not limited to the above-described effects, and any other effects not mentioned herein may be clearly understood from this specification and the accompanying drawings by those skilled in the art to which the inventive concept pertains.

The above description exemplifies the inventive concept. Furthermore, the above-mentioned contents describe embodiments of the inventive concept, and the inventive concept may be used in various other combinations, changes, and environments. That is, variations or modifications can be made to the inventive concept without departing from the scope of the inventive concept that is disclosed in the specification, the equivalent scope to the written disclosures, and/or the technical or knowledge range of those skilled in the art. The written embodiments describe the best state for implementing the technical spirit of the inventive concept, and various changes required in specific applications and purposes of the inventive concept can be made. Accordingly, the detailed description of the inventive concept is not intended to restrict the inventive concept in the disclosed embodiment state. In addition, it should be construed that the attached claims include other embodiments.

While the inventive concept has been described with reference to embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A tower lift comprising:
a rail module extending in a vertical direction;
a plurality of carriage modules configured to be movable along the rail module, each carriage module having a carriage configured to carry an object; and
an interference avoidance module configured to avoid travel interference between the plurality of carriage modules traveling opposite directions along the rail module,
wherein the rail module includes:
a frame extending in the vertical direction; and
a linear motor coil installed on the frame,
wherein each of the plurality of carriage modules includes a linear motor magnet coupled with the carriage and configured to interact with the linear motor coil to move the carriage in the vertical direction,
wherein the linear motor coil includes a plurality of linear motor coils installed on the frame so as to be spaced apart from each other along the vertical direction,
wherein each of the plurality of linear motor coils includes a pair of linear motor coils spaced apart from each other, and
wherein a part of the linear motor magnet, when viewed in a plan view, is inserted into a space between the pair of linear motor coils.

2. The tower lift of claim 1,
wherein each of the plurality of carriage modules is configured to be movable along the rail module in a magnetic levitation manner.

3. The tower lift of claim 1,
wherein the interference avoidance module includes:
a plurality of rails which are spaced apart from each other in a horizontal direction different from the vertical direction, one of the plurality of rails being aligned with the rail module;

a body, wherein the plurality of rails are installed thereon; and a driving part connected to the body and configured to move the body in the horizontal direction.

4. The tower lift of claim 3,
wherein each of the plurality of rails extends lengthwise in the vertical direction.

5. The tower lift of claim 3,
wherein the rail module is divided into a plurality of segmented rail modules which are spaced apart from each other in the vertical direction, and
wherein the interference avoidance module is disposed between two adjacent segmented rail modules among the plurality of segmented rail modules.

6. The tower lift of claim 3,
wherein the tower lift further comprises a controller,
wherein the plurality of carriage modules includes a first carriage module moving in a first direction and a second carriage module moving in a second direction opposite to the first direction, and
wherein when predicting travel interference between the first and second carriage modules, the controller is configured to control the driving part, and the first and second carriage modules such that:
the first carriage module is moved on a first rail of the plurality of rails that is combined with the rail module;
the body is moved in the horizontal direction; and
the rail module is combined with a second rail of the plurality of rails instead of the first rail.

7. The tower lift of claim 6,
wherein the controller is configured to, after the second rail is combined with the rail module, control the second carriage module such that the second carriage module is moved along the second rail combined with the rail module.

8. The tower lift of claim 1,
wherein the linear motor magnet has the shape of "T" when viewed from above.

9. The tower lift of claim 1,
wherein the rail module further includes at least one guide rail installed on the frame,
wherein each of the plurality of carriage modules further includes a guide part configured to move along the at least one guide rail, and
wherein the at least one guide rail and the guide part are spaced apart from each other by a magnetic repulsive force.

10. The tower lift of claim 9,
wherein the guide part has the shape of "⊂" when viewed from above, and
wherein the at least one guide rail is inserted into the guide part.

11. The tower lift of claim 9,
wherein one of the guide part and the at least one guide rail is equipped with a gap sensor, and
wherein a gap between the at least one guide rail and the guide part is controlled to be constant, based on a measurement value measured by the gap sensor.

12. The tower lift of claim 1,
wherein the rail module further includes a power transmitter,
wherein each of the plurality of carriage modules further includes a power receiver configured to receive power transmitted by the power transmitter, and
wherein the power transmitter transmits the power to the power receiver in a non-contact manner.

* * * * *